United States Patent
Zheng et al.

(10) Patent No.: US 10,903,398 B2
(45) Date of Patent: Jan. 26, 2021

(54) DIELECTRIC FILM COATING FOR FULL CONVERSION CERAMIC PLATELETS

(71) Applicant: OSRAM Opto Semiconductors GmbH, Regensburg (DE)

(72) Inventors: Yi Zheng, Lynnfield, MA (US); Dominik Eisert, Regensburg (DE); Georg Rossbach, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 16/269,422

(22) Filed: Feb. 6, 2019

(65) Prior Publication Data

US 2020/0251621 A1  Aug. 6, 2020

(51) Int. Cl.
  *H01L 21/00* (2006.01)
  *H01L 33/00* (2010.01)
  *H01L 33/50* (2010.01)

(52) U.S. Cl.
  CPC .......... *H01L 33/502* (2013.01); *H01L 33/50* (2013.01); *H01L 33/501* (2013.01); *H01L 33/504* (2013.01); *H01L 33/508* (2013.01); H01L 2933/0041 (2013.01)

(58) Field of Classification Search
  CPC ........................ H01L 33/508; H01L 33/502
  USPC ............................ 438/29–32, 69–72; 257/98
  See application file for complete search history.

(56) References Cited

U.S. PATENT DOCUMENTS

| | | | |
|---|---|---|---|
| 8,114,692 B2 * | 2/2012 | Krames | H01L 33/504 438/35 |
| 8,957,493 B1 | 2/2015 | Lin et al. | |
| 9,997,561 B2 * | 6/2018 | Cha | H01L 25/0655 |
| 10,184,618 B2 * | 1/2019 | Yoon | F21V 9/40 |
| 10,326,061 B2 * | 6/2019 | Lim | H01L 33/62 |
| 2012/0228653 A1 | 9/2012 | Ishida et al. | |
| 2013/0105850 A1 | 5/2013 | Komatsu et al. | |
| 2018/0182942 A1 | 6/2018 | Yuasa et al. | |
| 2018/0358339 A1 * | 12/2018 | Iguchi | G09G 3/3233 |
| 2018/0363860 A1 * | 12/2018 | Kasugai | F21K 9/64 |

FOREIGN PATENT DOCUMENTS

EP    1958269 A1    8/2008

OTHER PUBLICATIONS

Oh, J., et al., "Full down-conversion of amber-emitting phosphor-converted light-emitting diodes with powder phosphors and a long-wave pass filter," Optics Express, vol. 18, Issue 11, May 11, 2010, pp. 11063-11072.

* cited by examiner

*Primary Examiner* — Calvin Lee
(74) *Attorney, Agent, or Firm* — Slater Matsil, LLP

(57) ABSTRACT

The present invention is directed to a wavelength converter comprising: —a phosphor layer and—a filter layer, wherein the filter layer is directly attached to the phosphor layer and wherein the wavelength converter has an overall thickness of between 20 μm to 80 μm.
Furthermore, the present invention is directed to a light emitting device assembly and methods for preparing a wavelength converter and methods for preparing a light emitting device assembly.

20 Claims, 19 Drawing Sheets

DIELECTRIC FILM COATING FOR FULL CONVERSION CERAMIC PLATELETS

TECHNICAL FIELD

This invention relates to wavelength converters, light emitting device assemblies and methods for preparing wavelength converters and light emitting devices.

BACKGROUND

There are several embodiments of phosphor wavelength converters in the prior art. Often ceramic phosphor materials are used to convert light of a certain wavelength to a certain further wavelength. However, some of the ceramic phosphor materials show a scattering.

For example, amber ceramics with the composition $(Sr,Ba)_2Si_5N_8$:Eu are used for full conversion LED applications, where the blue light from a blue LED die is completely or nearly completely absorbed by an amber ceramic platelet converter on top of the LED die, and re-emitted at longer wavelengths as amber light. The full conversion amber LEDs have broad applications, such as automotive turn signal and tail lights, emergency vehicle signal lights and traffic signal lights.

In the past, the efforts to improve amber ceramic efficacy have been focused on improving densification of amber ceramics. By reducing porosity, the portion of scattering from pores is reduced. However, as the crystal structure of $(Sr,Ba)_2Si_5N_8$:Eu is not cubic, there is always grain boundary scattering caused by birefringence. Also it is difficult to get rid of a $Ba_1Si_7N_{10}$ secondary phase completely, as the scattering from the secondary phases always exists. So there is a limitation in improving efficacy by reducing porosity because scattering from grain boundary and second phases cannot be avoided.

U.S. Pat. No. 8,957,493 discloses a light emitting diode (LED) assembly comprising a layer of a wavelength converter and a filter layer.

Oh et al., Optics Express 2010, 18(11), 11063-11072 discloses an amber-phosphor LED with comprising a filter layer.

SUMMARY

It is an object of the present invention to obviate the disadvantages of the prior art.

It is another object of the present invention to provide a wavelength converter that might be used in LED applications.

It is a further object of the present invention to provide a method for preparing a wavelength converter and for providing a light emitting device.

It is also an object of the present invention to provide a wavelength converter and a light emitting device prepared by a method according to the present invention.

In accordance with one object of the present invention, there is provided a wavelength converter comprising:
 a phosphor layer and
 a filter layer,
 wherein the filter layer is directly attached to the phosphor layer and wherein the wavelength converter has an overall thickness of between about 20 µm to about 80 µm.

In accordance with another object of the present invention, there is provided a light emitting device assembly comprising:
 a LED die, and
 a wavelength converter comprising:
 a phosphor layer and
 a filter layer,
 wherein the filter layer is directly attached to the phosphor layer and wherein the wavelength converter has an overall thickness of between about 20 µm to about 80 µm.

In accordance with another object of the present invention, there is provided a method for preparing a wavelength converter comprising the steps:
 providing a glass substrate or a sapphire wafer,
 coating the glass substrate or the sapphire wafer with a filter layer comprising different metal oxides to prepare a coated glass substrate or coated sapphire wafer,
 providing a phosphor material, and
 attaching the coated glass substrate or coated sapphire wafer to the phosphor material, thereby providing a wavelength converter
 wherein the filter layer is directly attached to the phosphor layer and wherein the wavelength converter has an overall thickness of between about 20 µm to about 80 µm.

In accordance with another object of the present invention, there is provided a method for preparing a light emitting device assembly, comprising:
 providing a LED die, optionally attached to a leadframe,
 attaching a wavelength converter comprising:
 a phosphor layer and
 a filter layer
 to the LED die,
 wherein the filter layer is directly attached to the phosphor layer and wherein the wavelength converter has an overall thickness of between about 20 µm to about 80 µm.

In accordance with another object of the present invention, there is provided a wavelength converter prepared by a method according to the present invention.

In accordance with another object of the present invention, there is provided a light emitting device prepared by a method according to the present invention.

BRIEF DESCRIPTION OF THE DRAWINGS

The invention is explained in more detail below on the basis of the examples and with reference to the associated figures. The figures are diagrammatic and do not represent illustrations that are true to scale.

DETAILED DESCRIPTION OF ILLUSTRATIVE EMBODIMENTS

Figure 1:
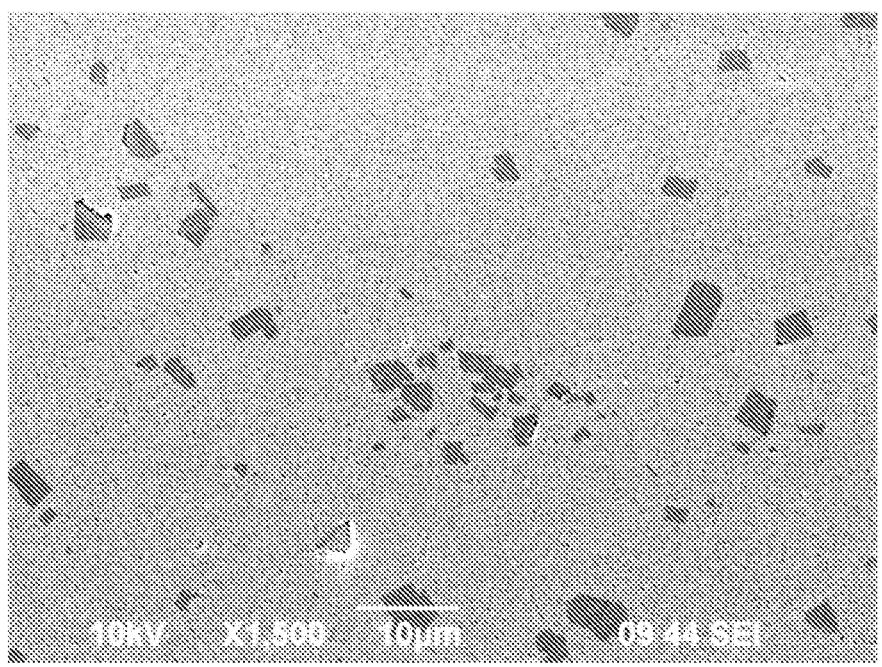
FIG. 1 shows a SEM picture of $(Sr,Ba)_2Si_5N_8$:Eu amber ceramic.

For a better understanding of the present invention, together with other and further objects, advantages and capabilities thereof, reference is made to the following disclosure and appended claims taken in conjunction with the above-described drawings.

References to the color of the phosphor, LED, or conversion material refer generally to its emission color unless otherwise specified. Thus, a blue LED emits a blue light, a yellow phosphor emits a yellow light and so on.

The present invention is directed to a wavelength converter comprising:
a phosphor layer and
a filter layer,
wherein the filter layer is directly attached to the phosphor layer and wherein the wavelength converter has an overall thickness of between 20 μm to 80 μm.

As used herein a wavelength converter is a solid structure that converts at least part of the light of a certain first wavelength to light of a certain second wavelength. In an embodiment, light of a certain first wavelength is blue light. Structures that can produce light of a first wavelength are, e.g., InGaN or GaN chips, or solid state laser diodes.

A phosphor is a material that converts light of a certain first wavelength to light of a certain second wavelength.

According to the present invention, the wavelength converter comprises a phosphor layer. The phosphor layer may consist of the phosphor material, or alternatively, comprise a host material in which the phosphor is intercalated. In the latter case, the phosphor might be intercalated in a ceramic host material or a glass host material. Preferably, the host materials are transparent for the incoming light of a certain first wavelength. The phosphor layer might also be a phosphor ceramic layer.

The phosphor layer (e.g., the phosphor ceramic layer) might have a smooth surface, preferably a polished surface.

Exemplary phosphors are garnets, oxynitridosilicates, perovskits, quantum dots, silicates or combinations thereof, each doped with at least one appropriate element.

In an embodiment, the phosphor is selected from the group consisting of $(Ba,Sr)_2Si_5N_8$:Eu$^{2+}$, Ca-α-SiAlON:Eu$^{2+}$, YAG:Ce+CaAlSiN$_3$:Eu, $(Ca,Sr)AlSiN_3$:Eu$^{2+}$, $(Sr,Ca)Al_2Si_2N_6$:Eu$^{2+}$, $(Ba,Sr,Ca)_2Si_5N_8$:Eu$^{2+}$ and Sr(LiAl$_3$N$_4$):Eu$^{2+}$.

The phosphor (e.g., the phosphor mentioned herein) can be mixed with a ceramic host material selected from the group consisting of undoped $(Ba,Sr)_2Si_5N_8$:Eu$^{2+}$, Ca-α-SiAlON or AlN, or a glass host material consisting of low melting temperature glass, borate silicate or phosphate glass.

In preferred embodiments, the phosphor layer is a layer of $(Ba,Sr,Ca)_2Si_5N_8$:Eu$^{2+}$, or $(Ba,Sr)_2Si_5N_8$:Eu$^{2+}$, i.e., a layer of amber ceramic. In a further preferred embodiment, the phosphor layer is $(Ba,Sr)_2Si_5N_8$:Eu$^{2+}$.

In an alternative embodiment, the phosphor layer comprises at least two different phosphors, at least three different phosphors, or at least four different phosphors.

In an embodiment, the certain second wavelength, i.e., the dominant wavelength that is obtained from the conversion of the certain first wavelength is about 590 nm. The phosphors that might convert the light to this wavelength are, e.g., $(Ba,Sr)_2Si_5N_8$:Eu$^{2+}$, Ca-α-SiAlON:Eu$^{2+}$ and YAG:Ce+CaAlSiN$_3$:Eu. The phosphors might be present as a ceramic layer, or might be present as a particle in a host material, such as a transparent ceramic, glass or silicone.

In an alternative embodiment, the certain second wavelength, i.e., the wavelength that is obtained from the conversion of the certain first wavelength is about 610 nm to about 630 nm. The phosphors that might convert the light to this wavelength are, e.g., $(Ca,Sr)AlSiN_3$:Eu$^{2+}$, $(Sr,Ca)Al_2Si_2N_6$:Eu$^{2+}$, $(Ba,Sr,Ca)_2Si_5N_8$:Eu$^{2+}$, Sr(LiAl$_3$N$_4$):Eu$^{2+}$. The phosphors might be present as a ceramic layer, or might be present as a particle in a host material, such as a transparent ceramic, glass or silicone.

In an alternative embodiment, the certain second wavelength, i.e., the wavelength that is obtained from the conversion of the certain first wavelength is more than about 700 nm. The phosphors that might convert the light to this wavelength are, e.g., $Cr^{3+/4+}$, $Ni^{2+}$, Bi, Yb, Tm, Er etc. doped host crystals and glasses (e.g., $La_3Ga_5GeO_{14}$, $Ga_2O_3$, $Gd_3Ga_3Sc_2O_{12}$, $Mg_2SiO_4$, etc.). The phosphors might be present as a particle in a host material, such as a transparent ceramic, glass or silicone.

The phosphor layer has preferably a shape-like structure. The thickness of the phosphor layer, i.e., the length of the phosphor layer through which the light traverses in a 90° angle with respect to the emitting source surface of the light of the certain first wavelength, is, e.g., between 420 to 465 nm, preferably 445 to 455 nm.

In an embodiment, there is more than one phosphor layer, e.g., there are 2 layers, 3 layers or more layers.

The wavelength converter further comprises a filter layer on top. The filter layer reflects unabsorbed excitation light of a certain first wavelength which is emitted, e.g., from a LED die. The phosphor layer absorbs at least part of the light of the certain first wavelength and converts it to a certain second wavelength and the filter layer reflects the unabsorbed light of a certain first wavelength, whereas the light of the certain second wavelength is transmitted.

The filter layer is directly attached to the phosphor layer. "Directly attached" in the context of the present invention means that there is at least one contact point between the phosphor layer and the filter layer. In a preferred embodiment at least one surface of the phosphor layer is covered with the filter layer.

The filter layer of the present invention may be a multi-layer of alternative oxides. The filter may be made by vapor or sputtering deposition of these oxide layers on a substrate. The substrate can be a phosphor layer, e.g., in ceramic form. In this case, there is preferably no glue in between the phosphor layer and the filter layer. Alternatively the substrate can be a thin glass or sapphire layer. In this case, the coated glass (or sapphire) is the filter layer. The filter layer is preferably glued to the phosphor layer.

In an embodiment, the filter layer comprises at least two metal oxides. The metal oxides of the filter layer might be present in one layer. In an alternative aspect of this embodiment, the filter layer comprises several sub-layers. Each of the sub-layers might comprise at least one metal oxide.

The filter layer might be a dichroic filter. A dichroic filter, thin-film filter, or interference filter is a very accurate color filter used to selectively pass light of a small range of colors while reflecting other colors.

In a dichroic mirror or filter alternating layers of optical coatings with different refractive indices are built up upon a glass substrate. The interfaces between the layers of different refractive index produce phased reflections, selectively reinforcing certain wavelengths of light and interfering with other wavelengths. The layers are usually added by vacuum deposition. By controlling the thickness and number of the layers, wavelength of the passband of the filter can be tuned and made as wide or narrow as desired. Because unwanted wavelengths are reflected rather than absorbed, dichroic filters do not absorb this unwanted energy during operation and so do not become nearly as hot as the equivalent conventional filter (which attempts to absorb all energy except for that in the passband).

The filter layer might comprise, e.g., two sub-layers, each comprising a different metal oxide. Preferably the metal oxides have contrast refractive indices. In an alternative embodiment, the filter layer comprises three or more sub-layers, each comprising a different or the same metal oxide, wherein preferably sub-layers of the same metal oxide are not attached to each other. Therefore, the filter layer might comprise n sub-layers and up to n different metal oxides. In a preferred embodiment, the filter comprises two metal oxides, one with a high refractive index and one with a low refractive index.

In an embodiment, the filter layer comprises 13 to 19 sub-layers. In a preferred embodiment, the filter layer comprises 15 to 18 sub-layers. In an even more preferred embodiment, the filter layer comprises 16 or 17 sub-layers. In a further preferred embodiment, the filter layer comprises 17 sub-layers.

The metal oxides of the filter layer might be selected from $SiO_2$, $Al_2O_3$, $TiO_2$, $Nb_2O_5$, $Ta_2O_5$, $HfO_2$ and $Y_2O_3$. Preferred metal oxides are pairs of $Al_2O_3$—$TiO_2$ or $SiO_2$—$Nb_2O_5$.

Dichroic filters normally need two oxides with a contrast refractive index, one has high refractive index, H, and the other has low refractive index, L. The filter preferably comprises alternative H, L layers with different thicknesses, such as H, L, H, L, H, L, H, L, H, L, etc.

In an embodiment, the filter layer comprises 17 sub-layers and two different metal oxides, such as alternating sub-layers of $Al_2O_3$ and $TiO_2$.

The filter layer has preferably a shape-like structure. The thickness of the filter layer, i.e., the length of the filter layer through which the light traverses in a 90° angle with respect to the emitting source surface, of the light of the certain first wavelength, is, e.g., between 420 to 465 nm, preferably 445 to 455 nm.

The sub-layers of the filter layer might each have a thickness of between about 20 nm to about 150 nm. In an embodiment, the sub-layers each have a thickness of between about 30 nm to about 40 nm.

The filter layer thickness is preferably related to the wavelength λ. The thickness is multiple times of ½ λ. In the present invention, a high reflectance at a wavelength below cutoff wavelength, such as below 535 nm, in the blue excitation light; and high transmission above cutoff wavelength, in the amber phosphor emission region should be reached.

The wavelength converter might further comprise an absorption layer above the filter. The absorption layer preferably absorbs light of wavelengths which shall not pass through the filter layer to be emitted.

Examples of absorption layers are layers of ion doped color filter glasses, comprising $MoS_2$ dyed glasses, Ce-doped Gallium-Gadolinium-YAG, or are selected from semiconductor materials like GaP, AlP, AlAs, CdSe, CdS in the form of thin layers or nanoparticles.

The absorption layer is preferably attached to the filter layer. The absorption layer might be attached to the filter layer with a glue or might be attached due to inherent absorption forces.

The filter layer has preferably a shape-like structure. The thickness of the filter layer, i.e., the length of the filter layer through which the light traverses in a 90° angle with respect to the emitting source surface of the light of the certain first wavelength, is, e.g., between about 420 nm to about 465 nm, preferably about 445 nm to 455 nm.

The wavelength converter has an overall thickness of between about 20 μm to about 80 μm. In an embodiment, the wavelength converter has a thickness of between about 40 μm to about 70 μm. In a preferred embodiment, the wavelength converter has a thickness of between about 40 μm to about 50 μm. The thickness of the wavelength converter is the length of the wavelength converter through which the light traverses in a 90° angle with respect to the emitting source surface of the light of the certain first wavelength.

It is a further object of the present invention to provide a light emitting device assembly comprising:
a LED die, and
a wavelength converter comprising:
a phosphor layer and
a filter layer,
wherein the filter layer is directly attached to the phosphor layer and wherein the wavelength converter has an overall thickness of between about 20 μm to about 80 μm.

The LED die preferably emits blue light. In an alternative embodiment, the LED die emits UV light. Examples of LED dies are GaN/InGaN based semiconductor materials.

The wavelength converter, the phosphor layer and the filter layer correspond to the respective means as described above.

It is an object of the present invention to provide a method for preparing a wavelength converter comprising the steps:
providing a glass substrate or a sapphire wafer,
coating the glass substrate or the sapphire wafer with a filter layer comprising different metal oxides to prepare a coated glass substrate or coated sapphire wafer,
providing a phosphor material, and
attaching the coated glass substrate or coated sapphire wafer to the phosphor material, thereby providing a wavelength converter,
wherein the filter layer is directly attached to the phosphor layer and wherein the wavelength converter has an overall thickness of between about 20 μM to about 80 μm.

In a step of the method for preparing a wavelength converter a glass substrate or a sapphire wafer is provided.

The glass substrate or the sapphire wafer is preferably transparent and therefore especially transmissive for wavelengths which shall be emitted from the wavelength converter.

The glass substrate or the sapphire wafer might have a thickness of between about 40 to about 200 um. In an embodiment, the glass substrate or the sapphire wafer might have a thickness of between about 40 to about 100 um.

In a further step, the glass substrate or the sapphire wafer is coated with at least two layers of metal oxides to provide a coated glass substrate or a coated sapphire wafer. The coating is preferably carried out by depositing a pair of $Al_2O_3$—$TiO_2$ or $SiO_2$—$Nb_2O_5$ oxides, however also other metal oxides can be deposited on the glass substrate or the sapphire wafer.

In an embodiment, the coating is carried out stepwise. So the first layer of at least one metal oxide is coated on the glass substrate or the sapphire wafer. In a subsequent step, a second layer of at least one metal oxide is coated on the glass first layer of at least one metal oxide. Further layers, if present, are introduced accordingly. As an optional step a drying step is present between the coating steps, or at least after the final coating step. The coating might be carried out by vapor or sputtering deposition.

In an embodiment of the present invention the layers of the metal oxides correspond to the sub-layers of the filter layer as mentioned herein and the sum of all layers of metal oxides that are coated on the glass substrate or the sapphire wafer correspond to the filter layer as mentioned herein.

In an embodiment, the metal oxides are selected from $SiO_2$, $Al_2O_3$, $TiO_2$, $Nb_2O_5$, $Ta_2O_5$, $HfO_2$ and $Y_2O_3$. Preferred metal oxides are pairs of $Al_2O_3$—$TiO_2$ or $SiO_2$—$Nb_2O_5$ oxides.

In an embodiment, there are 17 layers of metal oxides coated on the glass substrate or the sapphire wafer and the metal oxides are $Al_2O_3$ and $TiO_2$.

In a further step, a phosphor material is provided. Exemplary phosphors are garnets, oxynitridosilicates, perovskites, quantum dots, silicates or combinations thereof, each doped with at least one appropriate element.

In an embodiment, the phosphor material is selected from the group consisting of $(Ba,Sr)_2Si_5N_8:Eu^{2+}$, Ca-α-SiAlON:$Eu^{2+}$, YAG:Ce+CaAlSiN$_3$:Eu, $(Ca,Sr)AlSiN_3:Eu^{2+}$, $(Sr,Ca)Al_2Si_2N_6:Eu^{2+}$, $(Ba,Sr,Ca)_2Si_5N_8:Eu^{2+}$ and $Sr(LiAl_3N_4):Eu^{2+}$.

The phosphor (e.g., the phosphor mentioned herein) can be mixed with a ceramic host material selected from the group consisting of undoped $(Ba,Sr)_2Si_5N_8:Eu^{2+}$, Ca-α-SiAlON or AlN, or a glass host material consisting of low melting temperature glass, borate silicate or phosphate glass.

In preferred embodiments, the phosphor material is a layer of $(Ba,Sr)_2Si_5N_8:Eu^{2+}$, or $(Ba,Sr)_2Si_5N_8:Eu^{2+}$, i.e., a layer of amber ceramic. In a further preferred embodiment, the phosphor material is $(Ba,Sr)_2Si_5N_8:Eu^{2+}$.

In an alternative embodiment, the phosphor material comprises at least two different phosphors, at least three different phosphors, or at least four different phosphors.

In an embodiment, the certain second wavelength, i.e., the dominant wavelength that is obtained from the conversion of the certain first wavelength is about 590 nm. The phosphors that might convert the light to this wavelength are, e.g., $(Ba,Sr)_2Si_5N_8:Eu^{2+}$, Ca-α-SiAlON:$Eu^{2+}$ and YAG:Ce+CaAlSiN$_3$:Eu. The phosphors might be present as a ceramic layer, or might be present as a particle in a host material, such as transparent ceramic, glass or silicone.

In an alternative embodiment, the certain second wavelength, i.e., the wavelength that is obtained from the conversion of the certain first wavelength is about 610 nm to about 630 nm. The phosphors that might convert the light to this wavelength are, e.g., $(Ca,Sr)AlSiN_3:Eu^{2+}$, $(Sr,Ca)Al_2Si_2N_6:Eu^{2+}$, $(Ba,Sr,Ca)_2Si_5N_8:Eu^{2+}$, $Sr(LiAl_3N_4):Eu^{2+}$. The phosphors might be present as a ceramic layer, or might be present as a particle in a host material, such as a transparent ceramic, glass or silicone.

In an alternative embodiment, the certain second wavelength, i.e., the wavelength that is obtained from the conversion of the certain first wavelength is more than about 700 nm. The phosphors that might convert the light to this wavelength are, e.g., $Cr^{3+/4+}$, $Ni^{2+}$, Bi, Yb, Tm, Er etc. doped host crystals and glasses (e.g., $La_3Ga_5GeO_{14}$, $Ga_2O_3$, $Gd_3Ga_3Sc_2O_{12}$, $Mg_2SiO_4$, etc.). The phosphors might be present as a particle in a host material, such as a transparent ceramic, glass or silicone.

The coated glass substrate or the coated sapphire wafer is attached to the phosphor material to provide a wavelength converter. In an embodiment, the attaching of the coated glass substrate or coated sapphire wafer to the phosphor material is carried out by laminating the coated glass substrate or coated sapphire wafer to the phosphor material with a glue.

The glue might be transparent epoxy, silicone, or polysiloxane.

In a preferred embodiment, the phosphor material is attached to the metal oxide layer(s) and the glass substrate or the sapphire wafer is opposite to the phosphor material. In an alternative embodiment, the phosphor layer is attached to the glass substrate, or the sapphire wafer and the filter layer is opposite to the phosphor layer.

In a further embodiment, an adsorption layer as mentioned herein is attached to the filter layer.

In an embodiment, the wavelength converter is diced in smaller pieces. Typical sizes of a wavelength converter are 0.75 mm×0.75 mm, 1 mm×1 mm or 2 mm². In a preferred embodiment, the wavelength converter has a size of 1 mm×1 mm.

A further object of the present invention is to provide a method for preparing a light emitting device assembly, comprising:
providing a LED die, optionally attached to a leadframe,
attaching a wavelength converter comprising:
a phosphor layer and
a filter layer
to the LED die,
wherein the filter layer is directly attached to the phosphor layer and wherein the wavelength converter has an overall thickness of between about 20 μm to about 80 μm.

The LED die, the phosphor layer and the filter layer correspond to the respective means as described herein.

In an embodiment, the attaching of the wavelength converter is carried out by using silicone glue to the LED die.

A further object of the present invention is to provide a wavelength converter prepared by a method of the present invention.

A further object of the present invention is to provide a light emitting device prepared by a method of the present invention.

In an embodiment of the present invention, a wavelength converter of the present invention is used in LED packages for industrial, automotive lighting.

One typical microstructure of $(Sr,Ba)_2Si_5N_8$:Eu amber ceramic is shown in FIG. 1. The light color matrix phase is $(Sr,Ba)_2Si_5N_8$. The darker phases are $Ba_1Si_7N_{10}$. Some pores also exist in the ceramics. There can be quite a lot of scattering within the amber ceramics. The first scattering source is from grain boundary scattering since $(Sr,Ba)_2Si_5N_8$ is not a cubic structure. The secondary scattering is from the $Ba_1Si_7N_{10}$ secondary phases. The third scattering comes from the pores due to a large refractive index contrast between the pore and the matrix.

Figure 2:
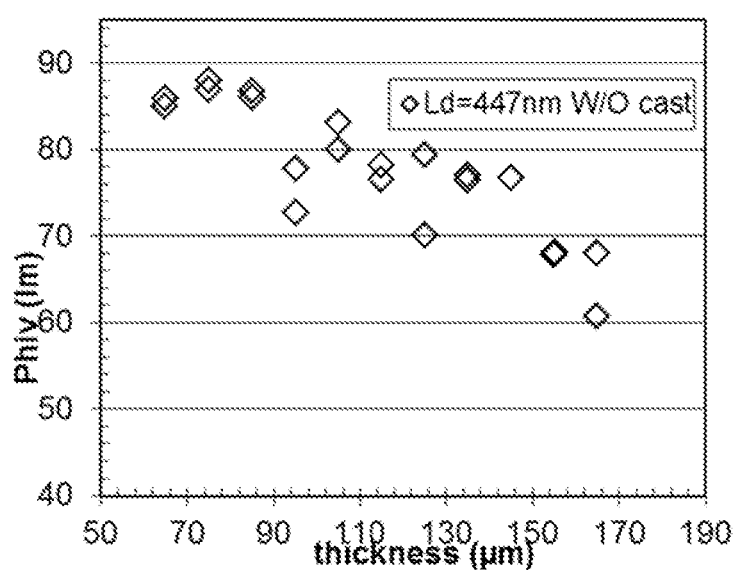
FIG. 2 shows lumens of $(Sr,Ba)_2Si_5N_8$:Eu amber ceramic LEDs vs the ceramic platelet thickness.

Due to the significant scattering often existing in the amber ceramics, the total scattering is dependent on the amber ceramic thickness. The thicker the samples, the more scattering exists. FIG. 2 shows lumens at a 350 mA drive current of LEDs using amber ceramic platelet converters with different thicknesses. Ld=447 nm means that the LED die emits blue light at a dominant wavelength of 447 nm. W/O cast means without white silicone casting around the LED die and converter. It shows clearly that the LED lumens decrease as the amber ceramic thickness increases. This is due to a more scattering reduced package efficacy.

Figure 3:
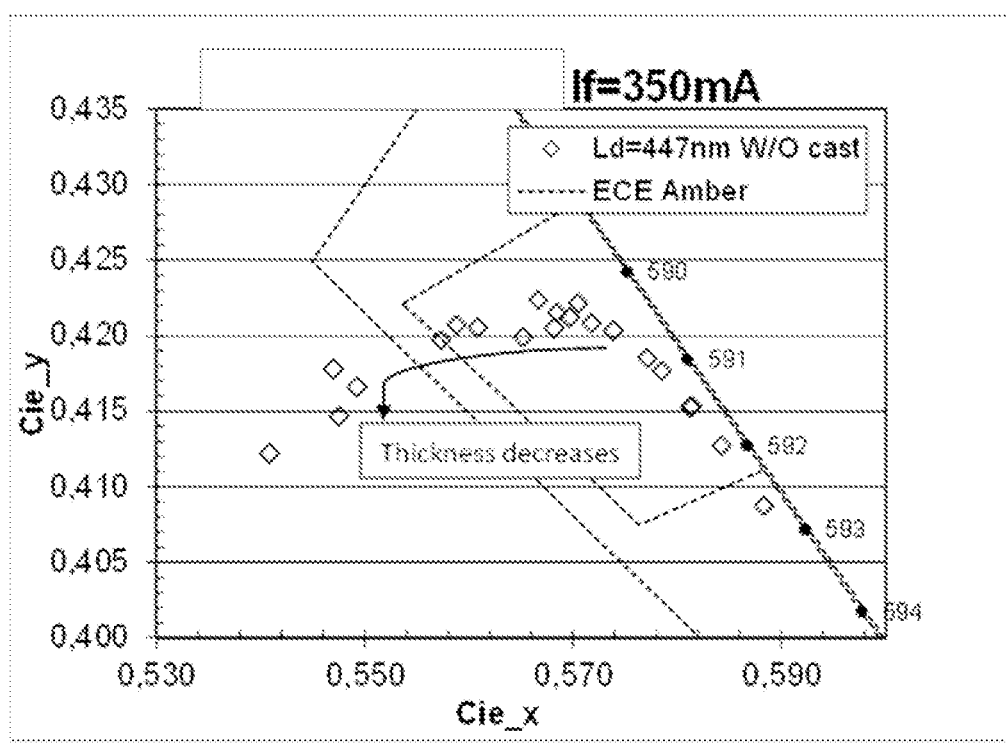
FIG. 3 shows the color of $(Sr,Ba)_2Si_5N_8$:Eu amber ceramic LEDs vs the ceramic thickness.

It seems naturally that a thinner amber ceramic would be preferred due to its higher package lumens. But according to the color of amber ceramic LEDs with various thicknesses shown in FIG. 3, the color of the thinnest amber ceramic LEDs falls outside of required color specification. The larger dashed line box is the ECE (Economic commission for Europe) amber color requirement. Although thinner amber ceramics give higher package lumens, they cannot absorb all the blue light and thus have more residual blue light. More blue residual light leads to the reduction of color Cx. The emission color shifts to higher emission dominant wavelength gradually when the thickness increases. This is due to the self-absorption of thick samples.

The current standard thickness of amber ceramics in wavelength converters is about 120 μm. Such a thickness would guarantee the ceramic is thick enough to absorb most of the light of a certain first wavelength, such as blue light. The platelets thickness was reduced down to about 90 and about 70 μm. The color and conversion efficacy CE were measured by an in-house pin hole setup: OSRAM Tester. A stabilized and constant blue light passes through a pin hole where the platelet sample sits on. The forward transmitted residual blue light and emitted amber light was collected by a small integrating sphere above the sample. The color and conversion efficacy CE (forward lumens divided by the incident blue powder, lm/W_b) were measured.

Figure 4:
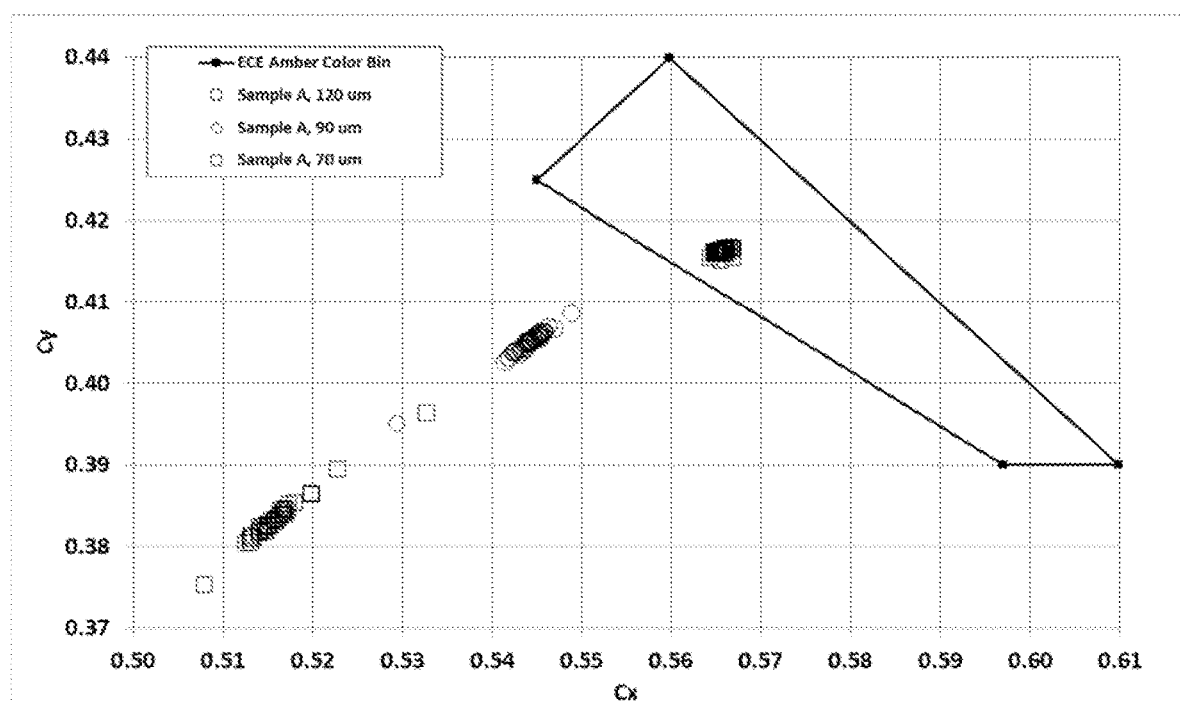
FIG. 4 shows the color of $(Sr,Ba)_2Si_5N_8$:Eu amber ceramic platelets with various thicknesses measured with OSRAM tester.

FIG. 4 shows the color distribution of amber ceramic platelets with 120, 90 and 70 μm. For a standard thickness of 120 μm, the platelets have an average CE of 91.4 lm/W. As the thickness decreases down to 90 and 70 μm, the CE increases to 96.4 and 98 lm/W respectively.

A wavelength converter with the filter layer according to the present invention was prepared. The phosphor material was a layer of amber ceramics. The filter was composed of 17 sub-layers of alternative materials with low and high refractive index, $Al_2O_3$ and $TiO_2$. (Table 1: filter design).

TABLE 1

| Sub-layer no. | Filter layer | Thickness [nm] |
| --- | --- | --- |
| 1 | $Al_2O_3$ | 37 |
| 2 | $TiO_2$ | 43 |
| 3 | $Al_2O_3$ | 63 |
| 4 | $TiO_2$ | 50 |
| 5 | $Al_2O_3$ | 62 |
| 6 | $TiO_2$ | 51 |
| 7 | $Al_2O_3$ | 66 |
| 8 | $TiO_2$ | 50 |
| 9 | $Al_2O_3$ | 68 |
| 10 | $TiO_2$ | 49 |
| 11 | $Al_2O_3$ | 65 |
| 12 | $TiO_2$ | 51 |

TABLE 1-continued

| Sub-layer no. | Filter layer | Thickness [nm] |
| --- | --- | --- |
| 13 | $Al_2O_3$ | 68 |
| 14 | $TiO_2$ | 48 |
| 15 | $Al_2O_3$ | 54 |
| 16 | $TiO_2$ | 53 |
| 17 | $Al_2O_3$ | 127 |
|  | Air |  |

Figure 5:
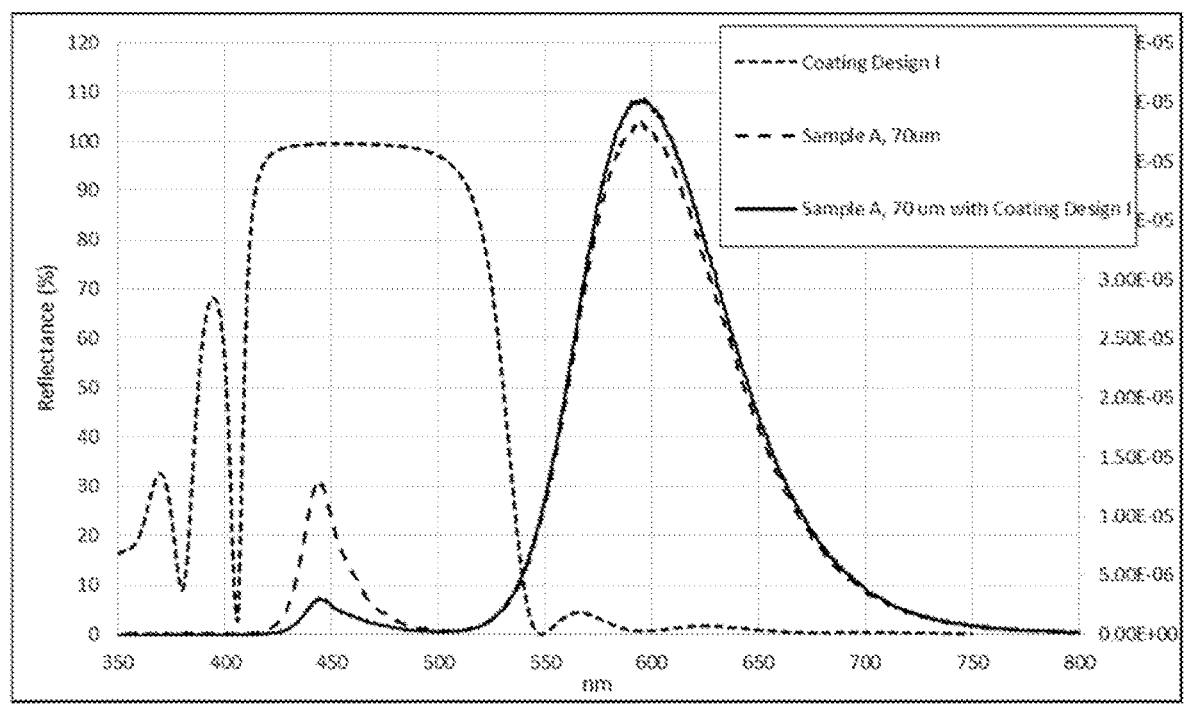
FIG. 5 shows reflectance of a filter layer according to Table 1 and emission of an amber platelet before and after the coating.

A reflectance curve simulated from the filter design in table 1 is shown in FIG. 5. It shows a high reflectance between 410 and 500 nm. The reflectance drops quickly above 500 nm with a cut-off wavelength at about 530 nm. Such coating can be made on amber ceramic platelets by electron beam evaporation, sputtering or other coating method. An amber platelet before and after the coating was measured by OSRAM Tester. The measurement results are compared to a simulated reflectance curve of the coating in FIG. 5. After the coating, the residual blue light near 450 nm is greatly reduced while amber emission near 600 nm is slightly increased.

Figure 6:
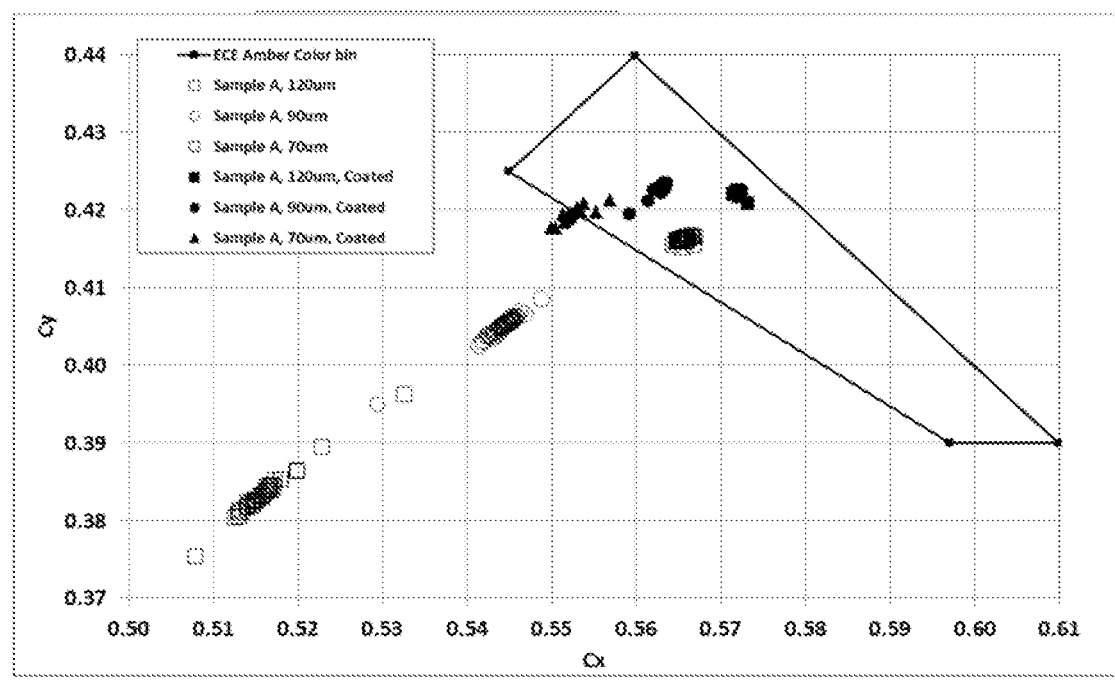
FIG. 6 shows the color of $(Sr,Ba)_2Si_5N_8$:Eu amber ceramic platelets with various thicknesses before and after coating measured with OSRAM tester.

FIG. 6 compares the color distribution of amber ceramic platelets with 120, 90 and 70 μm before and after the coating. The Cx of all coated platelets increases. The thinner the coated platelets, the more their Cx increases. The CE of coated platelets is about 1% higher than before coating the platelets.

Figure 7:
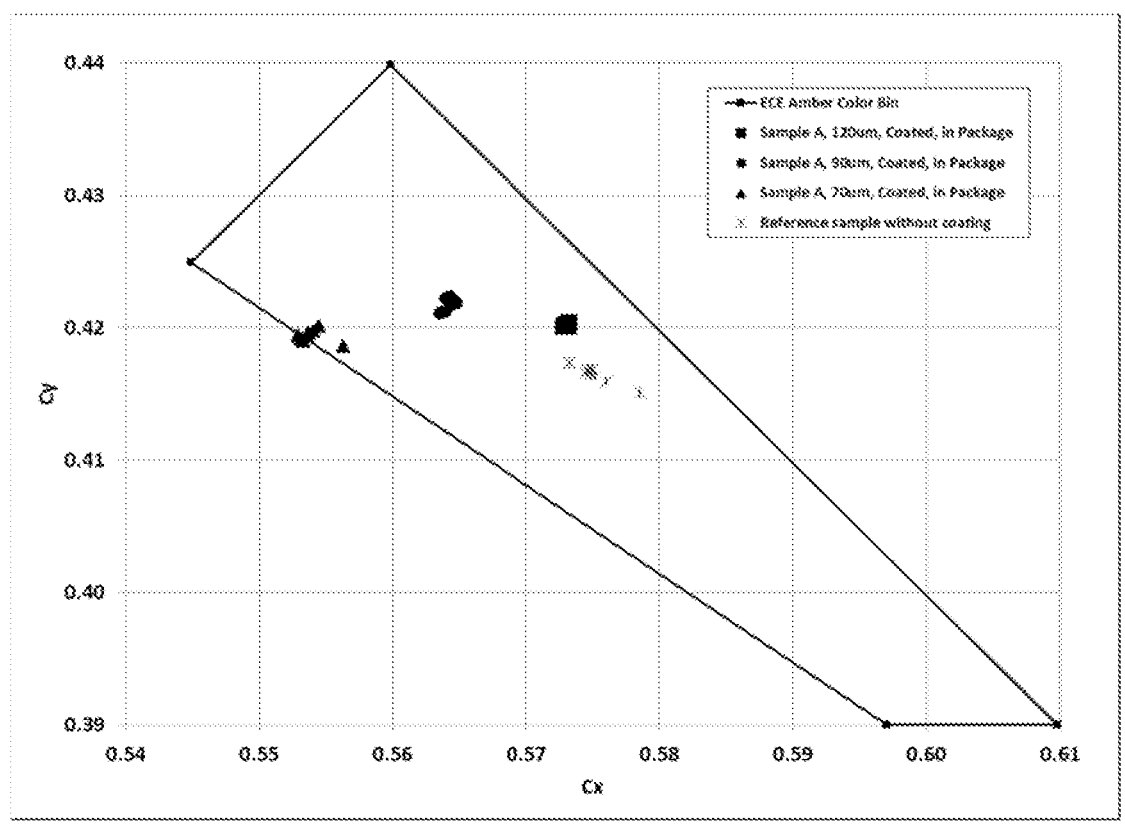
FIG. 7 shows the color of $(Sr,Ba)_2Si_5N_8$:Eu coated amber ceramic platelets in a LED package.
Figure 8:
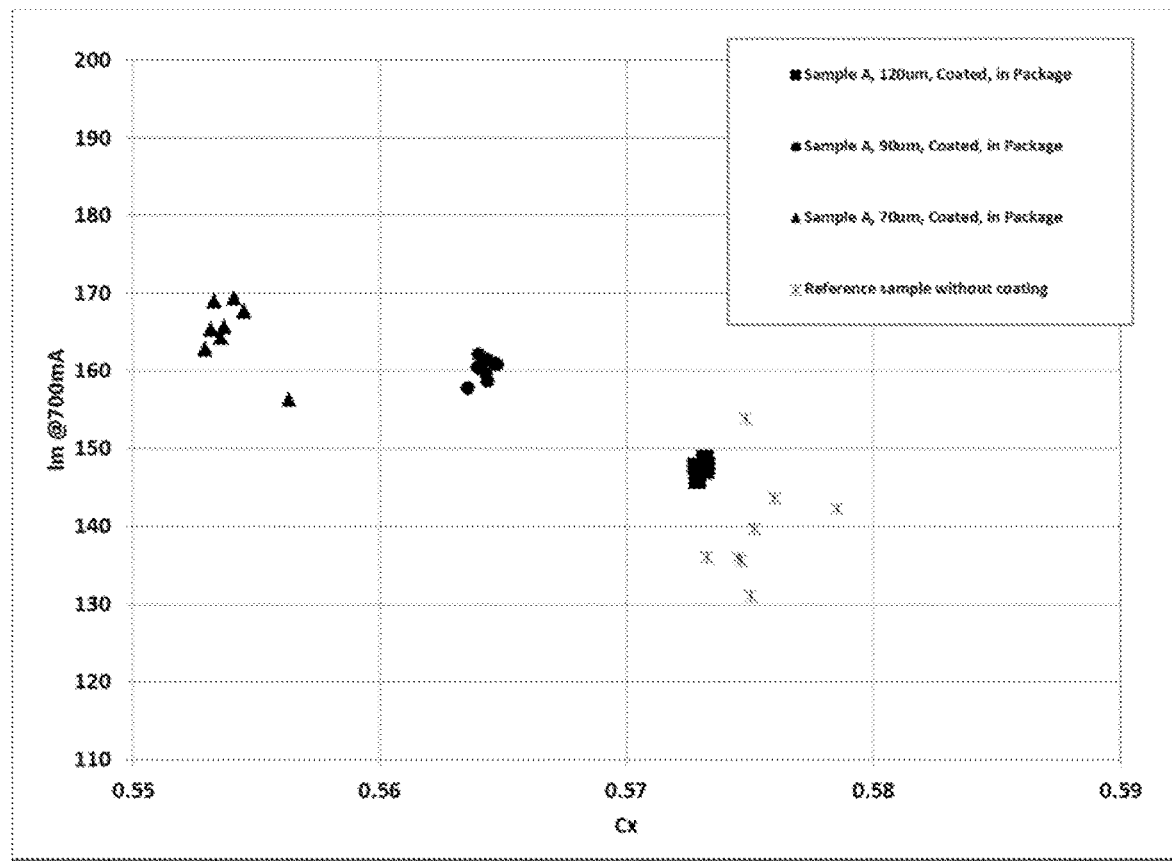
FIG. 8 shows the lumens of coated amber ceramic platelets in a LED package.

Coated platelets were assembled in a LED package together with uncoated produced amber platelets as reference. The emission color of coated amber platelets in the package (FIG. 7) is very similar to color measured by Osram tester in FIG. 6. The package lumens @700 mA for coated amber platelets are 5-18% higher than reference production uncoated platelets (FIG. 8).

Figure 9:
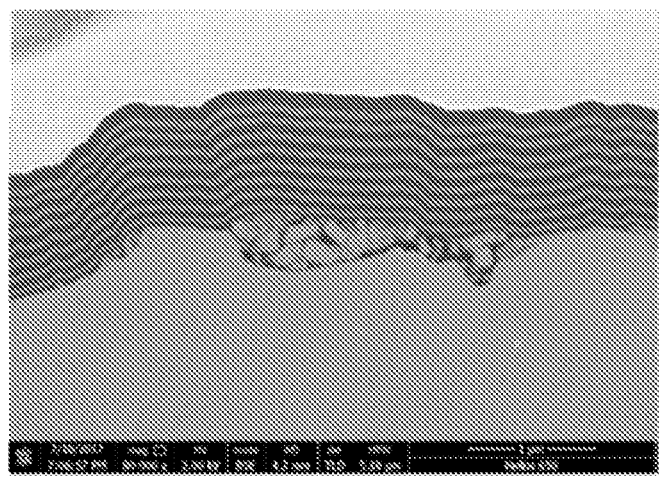
FIG. 9 shows a SEM image of a cross section of a coating on an amber ceramic plate.

In some embodiments, the amber ceramic surface finishing is a further aspect of the coating process. FIG. 9 shows a SEM image of a cross section of a coated amber ceramic. The ceramic surface is as ground, not very flat. The imperfection of the surface can negatively affect the coating in two ways. First, it can reduce the coating quality. Secondly, it can introduce a scattering which will affect the incident angle of light to the coating. The reflectance of the coating can depend on the incident angle of light. As the incident angle increases, the reflectance curve in FIG. 5 will shift to left and the cutoff wavelength will decrease. So the scattering caused by the imperfection of the surface can change the reflectance/transmittance. It is preferred to have a polished surface of amber ceramic for the coating purpose.

The amber platelets with 70, 90 and 120 μm thickness were polished down to 1 μm with a diamond slurry. Then the polished platelets and as ground platelets were coated with the layers according to table 2.

TABLE 2

| Sub-layer no. | Filter layer | Thickness [nm] |
| --- | --- | --- |
| 1 | $Al_2O_3$ | 32.7 |
| 2 | $TiO_2$ | 53.1 |
| 3 | $Al_2O_3$ | 55 |
| 4 | $TiO_2$ | 51.3 |
| 5 | $Al_2O_3$ | 67 |
| 6 | $TiO_2$ | 53.9 |
| 7 | $Al_2O_3$ | 60.9 |
| 8 | $TiO_2$ | 56 |
| 9 | $Al_2O_3$ | 68.1 |
| 10 | $TiO_2$ | 46.4 |
| 11 | $Al_2O_3$ | 71.1 |

TABLE 2-continued

| Sub-layer no. | Filter layer | Thickness [nm] |
|---|---|---|
| 12 | TiO$_2$ | 59.6 |
| 13 | Al$_2$O$_3$ | 48.9 |
| 14 | TiO$_2$ | 52.4 |
| 15 | Al$_2$O$_3$ | 63 |
| 16 | TiO$_2$ | 57.1 |
| 17 | Al$_2$O$_3$ | 128.8 |
| | Air | |

Figure 10:
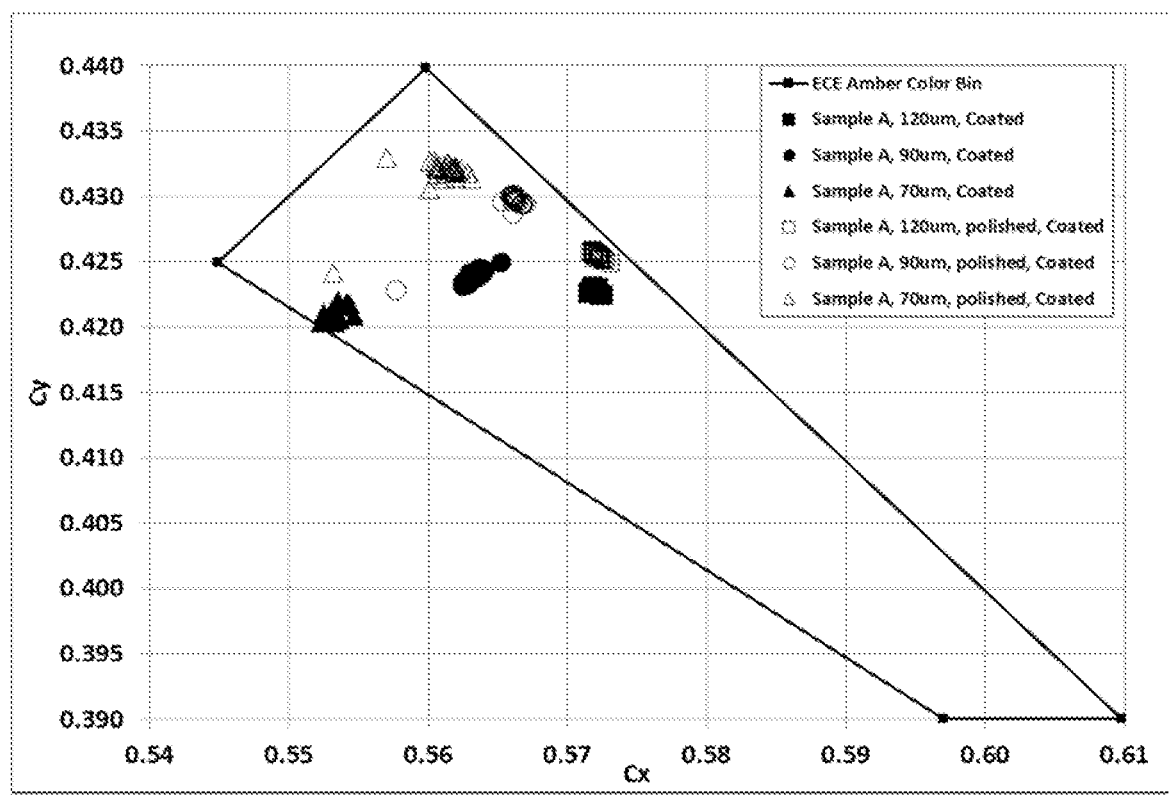
FIG. 10 shows the color of coated amber ceramic platelets with unpolished and polished surfaces tested with OSRAM tester measurement.

The coated polished and un-polished platelets were measured by OSRAM tester (FIG. 10). All the polished platelets color is more saturated than unpolished platelets, which is indicated by an increase of Cx, which means there is less residual blue in coated polished platelets. Their CE is also 1-2% higher.

Figure 11:
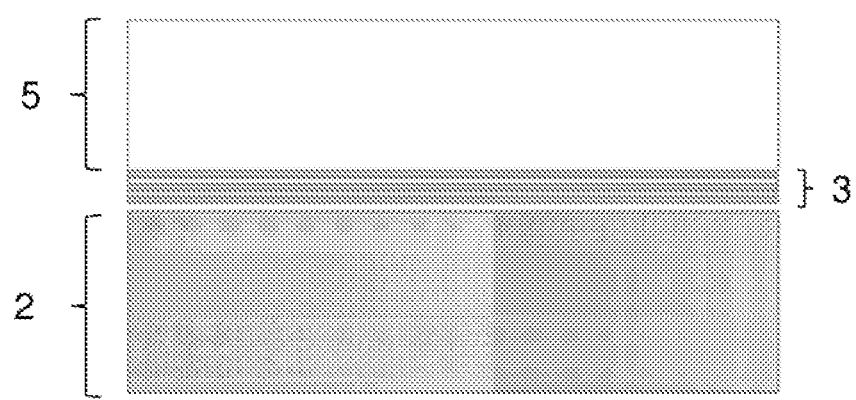
FIG. 11 shows a schematic view of a filter layer on a transparent layer on top of an amber ceramic plate.

Another embodiment is a stack of a thin assembly of a phosphor layer and a filter layer with another transparent layer, preferably glass, Al$_2$O$_3$, or Silicone (FIG. 11). Between the transparent layer 5 and the phosphor layer 2 is the filter layer 3. The filter layer can be applied to the transparent layer 5 in high volume processes first and then glued to the phosphor layer 2 (e.g., (Sr,Ba)$_2$Si$_5$N$_8$ amber ceramics) by transparent epoxy, silicone, or polysiloxane, water glass or a low melting glass.

Figure 12:
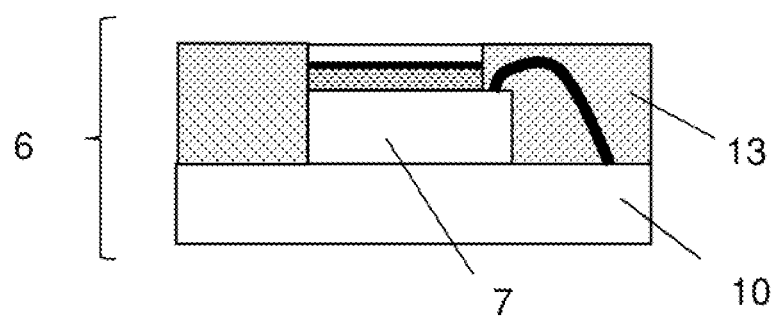
FIG. 12 shows a schematic view of a filter layer on a transparent layer on top of an amber ceramic in a LED package.

The advantage of this embodiment is that a transparent layer, such as glass, can have a much smoother surface than ceramics. Therefore, the filter layer on such a phosphor layer can have a better quality. Since the disclosure uses thinned amber ceramic with less scattering, one possible issue is the ceramic's height is lower than maximum point of bonding wire (FIG. 12). The highest portion of wire cannot be covered by casting protection material, such as silicone. So another advantage of this embodiment is that the total thickness of the hybrid can be adjusted such that it is higher than the bonding wire, so the whole bonding wires can be protected by sidewall protection casting in the package (FIG. 12).

Figure 13:
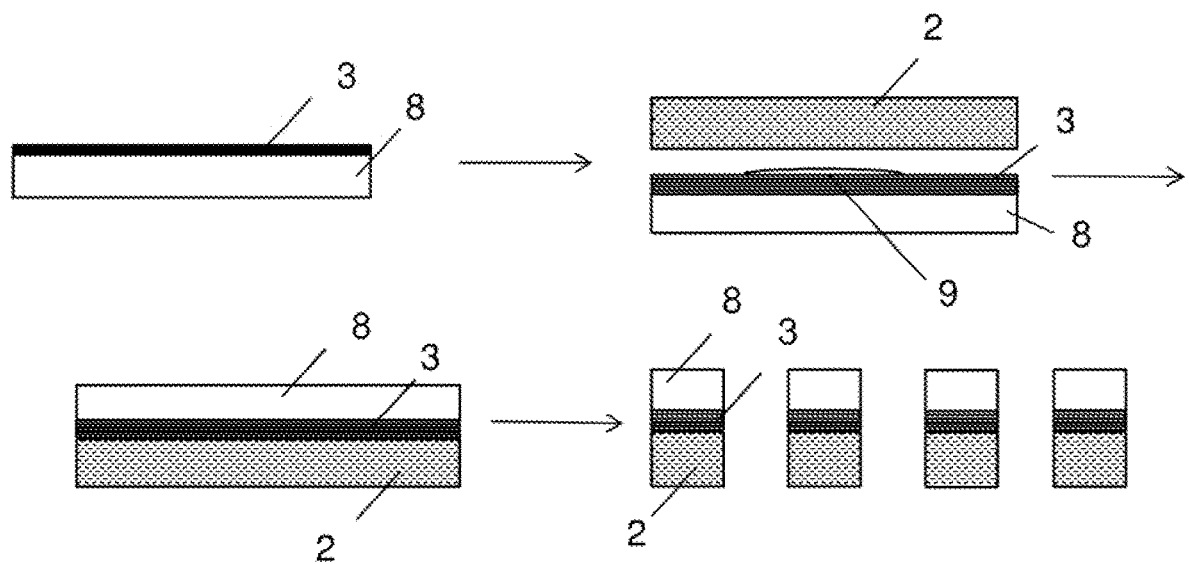
FIG. 13 shows an exemplary method for preparing a wavelength converter.

FIG. 13 shows an exemplary method for preparing a wavelength converter. In a first step a filter layer 3 is deposited on a glass substrate or a sapphire wafer 8. The phosphor layer 2 is attached to the filter layer with a glue 9. This leads to a so-called multilayer stack. In a further step, the multilayer stack is diced into smaller pieces in a subsequent step.

Figure 14:
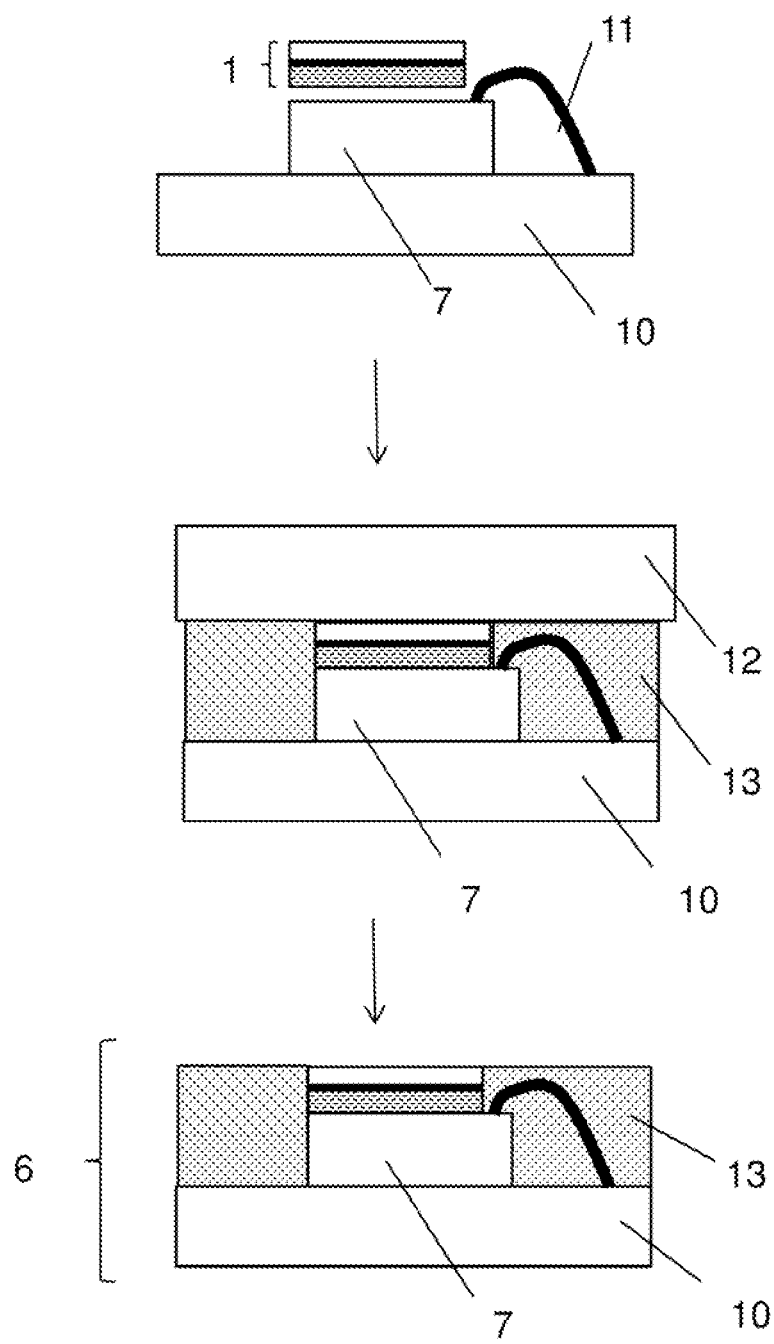
FIG. 14 shows an exemplary method for preparing a light emitting device assembly.

FIG. 14 shows an exemplary method for preparing a light emitting device assembly 6. In a first step, the wavelength converter 1 is attached to the LED die 7, which is attached to a leadframe 10. A bonding wire 11 is attached to the LED die 7. In a subsequent step, the assembly is molded with a mold tool 12 in a transfer molding step and a protection silicone casting 13 is present. After the molding step a light emitting device assembly 6 is obtained.

Figure 15:
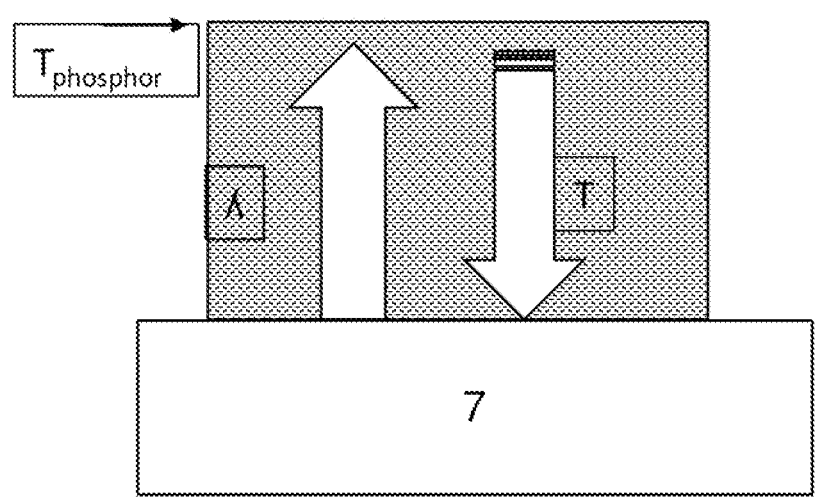
FIG. 15 shows a schematic view of light and heat transmission in a thick ceramic.
Figure 16:
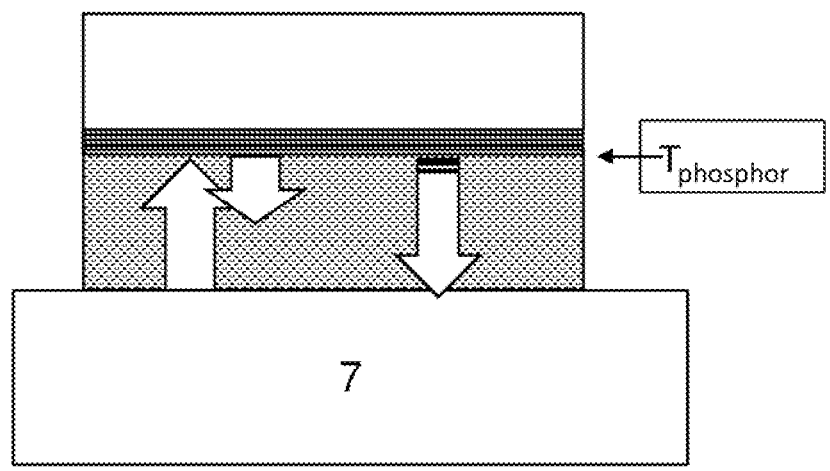
FIG. 16 shows a schematic view of light and heat transmission in a thin ceramic.

FIG. 15 shows an exemplary thick ceramic, while FIG. 16 shows an inventive thin ceramic. The conversion of blue light into light of longer wavelength in the converter ceramics creates heat by Stokes shift losses. This leads to temperature rise in the ceramics element. The thermal resistance of the converter element and therefore the maximum temperature increases with thickness. Conversion efficiency is reduced with temperature, degradation increased. Therefore reducing the thickness of the ceramics improves the performance of the conversion LED particularly in high power applications with current densities >1 A/mm$^2$. Therefore a thin ceramics layer d<70 μm with coating is better than a thick layer. In summary $R_{th\_thick} > R_{th\_thin}$ leads to $T_{thick} > T_{thin}$.

Figure 17:
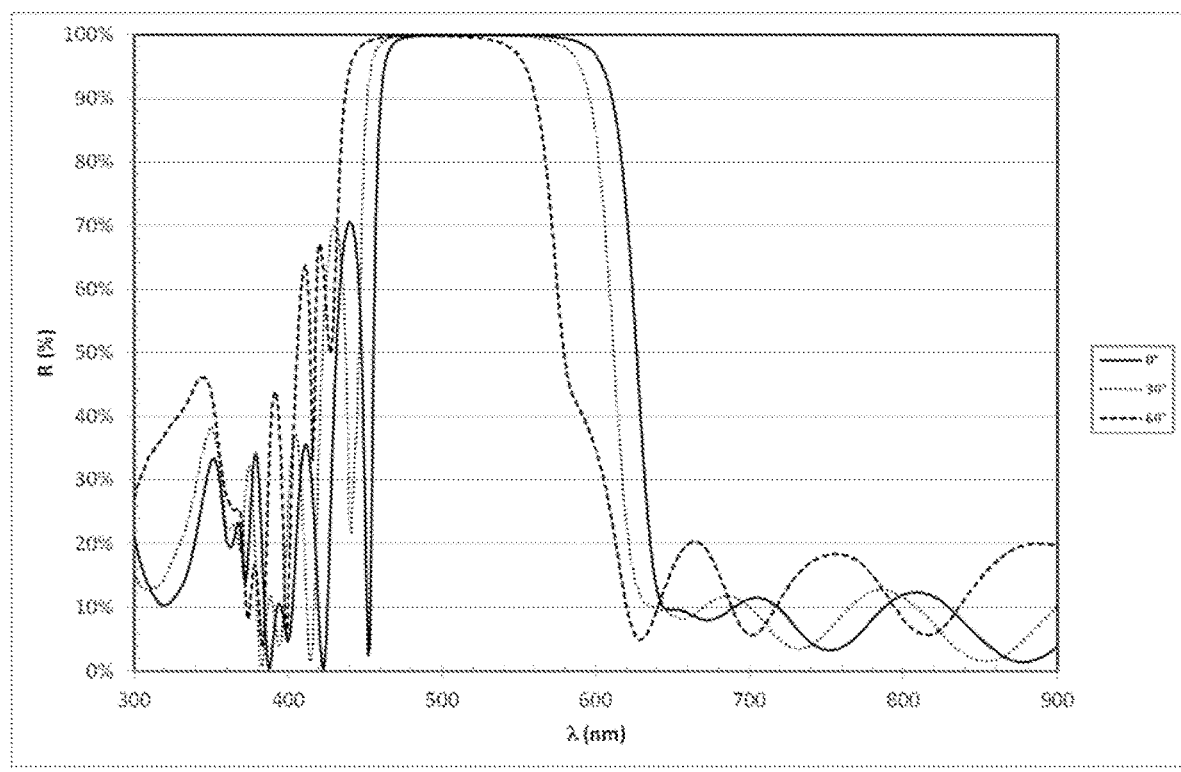
FIG. 17 shows the spectral reflective properties of the filter layer at different angles of incidence.

FIG. 17 shows the reflective properties of a coating. A problem is that the reflection band of dielectric coating shifts in wavelength with angle of incidence. 100% reflection of broad blue LED (FWHM-25 nm) cannot be secured for all angles of incidence. Therefore, the color is less saturated, e.g., for high angles of incidence. A possible solution is to add a wavelength selective absorptive layer on top of the filter layer, which leads to an absorption of blue light and therefore to the transmission of light of a longer wavelength. The majority of unabsorbed blue light (e.g., >90%) is reflected by the filter layer, the residual part absorbed by the blue filter. The filter layer band and blue LED should be tuned such that vertical incidence is reflected best and higher angles are partially transmitted, since the optical path length in the absorptive layer is longer for higher angles of incidence.

Figure 18:
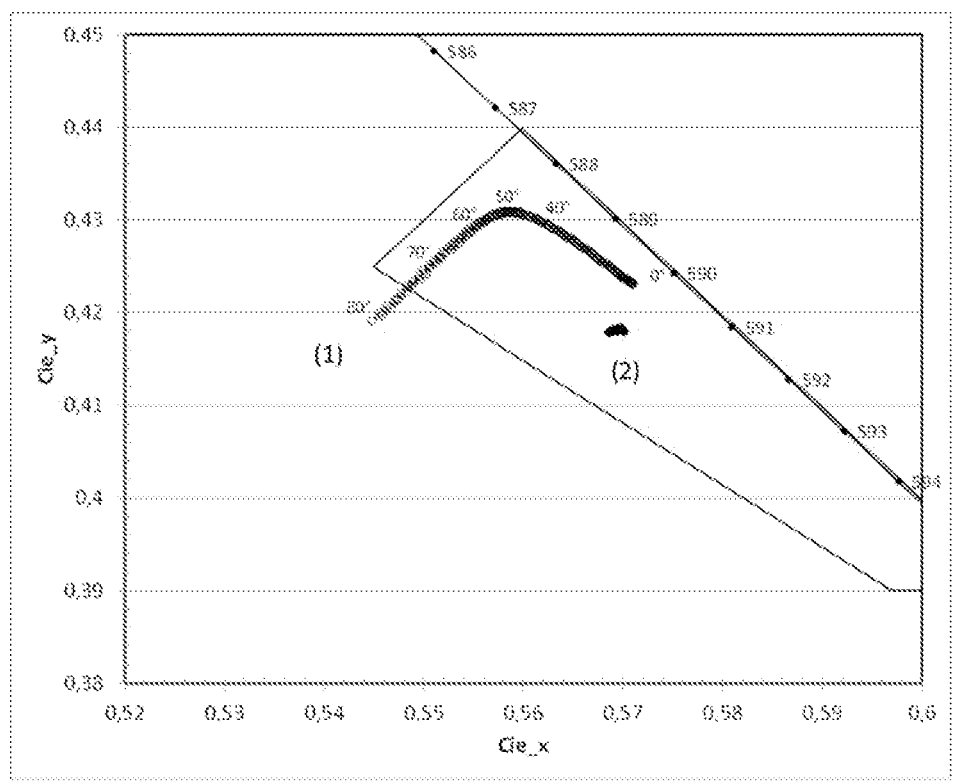
FIG. 18 shows the color of $(Sr,Ba)_2Si_5N_8$:Eu amber ceramic LEDs as seen from different observation angles for (1) a thin ceramics layer with filter layer and (2) thick ceramics layer without filter.

FIG. 18 shows the color of an LED with ceramics layer as seen from different observation angles. 0° is for observation along the optical axis, larger angles for oblique observation. While for a thick ceramics layer without mirror (2) the color shift between direct and oblique observation is low, it can vary significantly for the case of a thin ceramics layer with a dielectric filter (1). This case may require blocking of light from oblique angles, additional mixing optics, or as described an additional absorbing layer on top of the reflective mirror.

Figure 19:
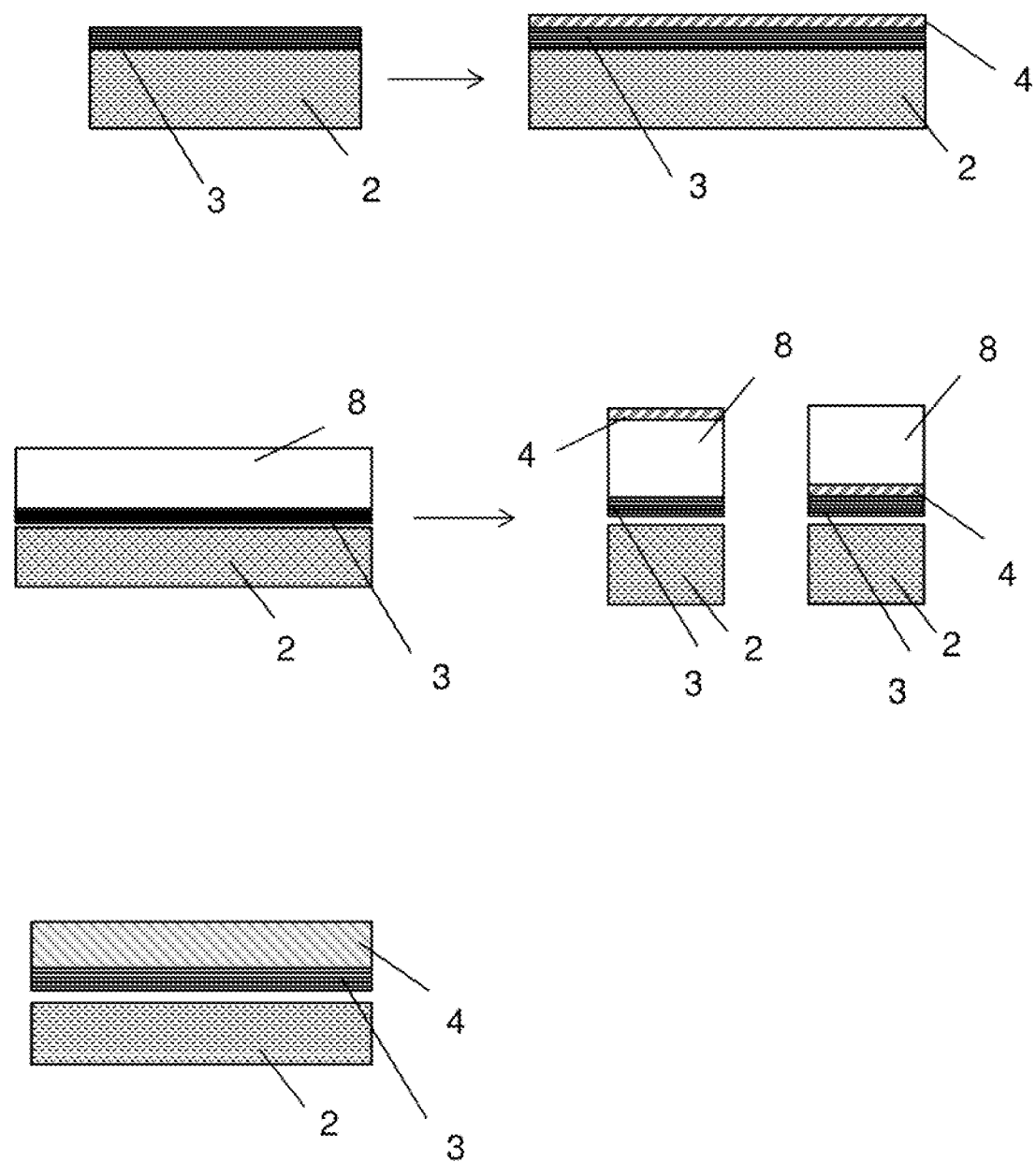
FIG. 19 shows exemplary embodiments of wavelength converters.

FIG. 19 shows different embodiments of wavelength converters 1. An absorption layer 4 could be directly deposited on top of the filter layer 3, or on the lower or upper side of the glass substrate or sapphire wafer 8. Another option is to coat a blue filter glass with the filter layer 3. Materials for the absorption layers can comprise: ion doped glasses (Schott filter glasses), converter materials with high activator concentration and high quenching, or particularly for thin coatings semiconductor materials with band gap larger than the emission (e.g., GaP or similar for yellow).

With the methods and means described herein, the advantage of higher efficacy of thinner ceramics and meanwhile to make sure its color falls inside of color requirements.

In general thick layers of wavelength converters are often inefficient because of scattering, however they often have a high color saturation. It is often that the thinner the wavelength converters are, the less scattering occurs in combination with a higher efficiency, but a low color saturation. The wavelength converters of the present invention show low scattering, low back reflection, a high efficiency and a good saturation.

While there have been shown and described what are at present considered to be preferred embodiments of the invention, it will be apparent to those skilled in the art that various changes and modifications can be made herein without departing from the scope of the invention as defined by the appended claims. The disclosure rather comprises any new feature as well as any combination of features, which in particular includes any combination of features in the appended claims, even if the feature or combination is not per se explicitly indicated in the claims or the examples.

What is claimed is:

1. A method for preparing a light emitting device assembly, the method comprising:
   providing a LED die; and
   attaching a wavelength converter to the LED die, wherein the wavelength converter comprises a phosphor layer and a filter layer, and wherein the wavelength converter is manufactured by:
   coating a glass substrate or a sapphire wafer with the filter layer,
   laminating the glass substrate or the sapphire wafer to a phosphor material using a glue thereby forming the phosphor layer,
   wherein the filter layer is directly attached to the phosphor layer,
   wherein the filter layer comprises different metal oxides, and
   wherein the wavelength converter has an overall thickness between 20 µm and 120 µm.

2. The method according to claim 1, wherein the phosphor material is selected from the group consisting of $(Ba,Sr)_2Si_5N_8:Eu^{2+}$, $Ca\text{-}\alpha\text{-}SiAlON:Eu^{2+}$, $YAG:Ce^+CaAlSiN_3:Eu$, $(Ca,Sr)AlSiN_3:Eu^{2+}$, $(Sr,Ca)Al_2Si_2N_6:Eu^{2+}$, $(Ba,Sr,Ca)_2Si_5N_8:Eu^{2+}$ and $Sr(LiAl_3N_4):Eu^2$.

3. The method according to claim 1, wherein the metal oxides are selected from the group consisting of $SiO_2$, $Al_2O_3$, $TiO_2$, $Nb_2O_5$, $Ta_2O_5$, $HfO_2$, and $Y_2O_3$.

4. The method according to claim 1, wherein the LED die comprises GaN/InGaN based semiconductor materials.

5. The method according to claim 1, wherein the wavelength converter has an overall thickness between 20 µm and 80 µm.

6. The light emitting device assembly prepared according to the method of claim 1.

7. A method for preparing a wavelength converter, the method comprising:
   providing a glass substrate;
   coating the glass substrate with a filter layer comprising different metal oxides to prepare a coated glass substrate;
   providing a phosphor material; and
   attaching the coated glass substrate to the phosphor material, thereby providing the wavelength converter comprising a phosphor layer,
   wherein attaching the coated glass substrate to the phosphor material comprises laminating the coated glass substrate to the phosphor material with a glue,
   wherein the filter layer is directly attached to the phosphor layer, and
   wherein the wavelength converter has an overall thickness between 20 µm and 120 µm.

8. The method according to claim 7, wherein the phosphor material is selected from the group consisting of $(Ba,Sr)_2Si_5N_8:Eu^{2+}$, $Ca\text{-}\alpha\text{-}SiAlON:Eu^{2+}$, $YAG:Ce+CaAlSiN_3:Eu$, $(Ca,Sr)AlSiN_3:Eu^{2+}$, $(Sr,Ca)Al_2Si_2N_6:Eu^{2+}$, $(Ba,Sr,Ca)_2Si_5N_8:Eu^{2+}$ and $Sr(LiAl_3N_4):Eu^2$.

9. The method according to claim 7, wherein the metal oxides are selected from the group consisting of $SiO_2$, $Al_2O_3$, $TiO_2$, $Nb_2O_5$, $Ta_2O_5$, $HfO_2$, and $Y_2O_3$.

10. The method according to claim 7, further comprising attaching an absorption layer to the wavelength converter.

11. The method according to claim 7, wherein the wavelength converter has an overall thickness between 20 µm and 80 µm.

12. The method according to claim 7, further comprising dicing the wavelength converter.

13. The wavelength converter prepared according to the method of claim 7.

14. A method for preparing a wavelength converter, the method comprising:
   providing a sapphire wafer;
   coating the sapphire wafer with a filter layer comprising different metal oxides to prepare a coated sapphire wafer;
   providing a phosphor material; and
   attaching the coated sapphire wafer to the phosphor material, thereby providing the wavelength converter comprising a phosphor layer,
   wherein attaching the coated sapphire wafer to the phosphor material comprises laminating the coated sapphire wafer to the phosphor material with a glue,
   wherein the filter layer is directly attached to the phosphor layer, and
   wherein the wavelength converter has an overall thickness between 20 µm and 120 µm.

15. The method according to claim 14, wherein the phosphor material is selected from the group consisting of $(Ba,Sr)_2Si_5N_8:Eu^{2+}$, $Ca\text{-}\alpha\text{-}SiAlON:Eu^{2+}$, $YAG:Ce^+CaAlSiN_3:Eu$, $(Ca,Sr)AlSiN_3:Eu^{2+}$, $(Sr,Ca)Al_2Si_2N_6:Eu^{2+}$, $(Ba,Sr,Ca)_2Si_5N_8:Eu^{2+}$ and $Sr(LiAl_3N_4):Eu^2$.

16. The method according to claim 14, wherein the metal oxides are selected from the group consisting of $SiO_2$, $Al_2O_3$, $TiO_2$, $Nb_2O_5$, $Ta_2O_5$, $HfO_2$, and $Y_2O_3$.

17. The method according to claim 14, wherein the wavelength converter has an overall thickness between 20 µm and 80 µm.

18. The method according to claim 14, further comprising attaching an absorption layer to the wavelength converter.

19. The method according to claim 14, further comprising dicing the wavelength converter.

20. The wavelength converter prepared according to the method of claim 14.

* * * * *